United States Patent
Stewart

(10) Patent No.: US 11,290,656 B2
(45) Date of Patent: Mar. 29, 2022

(54) METHOD OF OPERATING A LEAKY INTEGRATOR, LEAKY INTEGRATOR AND APPARATUS COMPRISING A LEAKY INTEGRATOR

(71) Applicant: STMICROELECTRONICS (RESEARCH & DEVELOPMENT) LIMITED, Marlow (GB)

(72) Inventor: Brian Douglas Stewart, Edinburgh (GB)

(73) Assignee: STMICROELECTRONICS (RESEARCH & DEVELOPMENT) LIMITED, Marlow (GB)

( * ) Notice: Subject to any disclaimer, the term of this patent is extended or adjusted under 35 U.S.C. 154(b) by 75 days.

(21) Appl. No.: 16/814,467

(22) Filed: Mar. 10, 2020

(65) Prior Publication Data

US 2020/0296308 A1    Sep. 17, 2020

(30) Foreign Application Priority Data

Mar. 15, 2019    (EP) .................................... 19163101

(51) Int. Cl.
| | |
|---|---|
| *H04N 5/235* | (2006.01) |
| *H03H 17/02* | (2006.01) |
| *H04N 5/238* | (2006.01) |
| *H04N 9/73* | (2006.01) |
| *G06T 5/00* | (2006.01) |

(52) U.S. Cl.
CPC ........... *H04N 5/2357* (2013.01); *G06T 5/009* (2013.01); *H03H 17/0294* (2013.01); *H04N 5/238* (2013.01); *H04N 9/735* (2013.01)

(58) Field of Classification Search
CPC .. H04N 5/235–243; H04N 9/64; H04N 9/643; H04N 9/646; H04N 9/68–71; H04N 9/73; H04N 9/735; H04N 9/77; H04N 9/793–7933; G06T 5/00; G06T 5/001; G06T 5/002; G06T 5/007; G06T 5/008; G06T 5/009; G06T 5/20
See application file for complete search history.

(56) References Cited

U.S. PATENT DOCUMENTS

| | | | |
|---|---|---|---|
| 2002/0097328 A1* | 7/2002 | Henderson | ............. H04N 5/235 348/241 |
| 2005/0163372 A1* | 7/2005 | Kida | ........................ H04N 9/68 382/169 |

(Continued)

FOREIGN PATENT DOCUMENTS

| | | |
|---|---|---|
| WO | WO 2016/164151 A1 | 10/2016 |
| WO | WO 2016/183522 A1 | 11/2016 |
| WO | WO 2017/048195 A1 | 3/2017 |

OTHER PUBLICATIONS

Impoco et al., "Adaptive Reduction of the Dynamics of HDR Video Sequences," IEEE International Conference on Image Processing, Sep. 14, 2005, Genova, Italy, 4 pages.

(Continued)

*Primary Examiner* — Paul M Berardesca

(57) ABSTRACT

The present disclosure relates to receiving an input signal; generating an output signal by integrating a leaked signal over an integration time, wherein the leaked signal is obtained based on a dampening signal, a leak factor and the input signal; and providing the output signal.

20 Claims, 11 Drawing Sheets

(56) References Cited

U.S. PATENT DOCUMENTS

| | | | |
|---|---|---|---|
| 2010/0238356 A1* | 9/2010 | Kida | G09G 5/00 |
| | | | 348/618 |
| 2014/0307840 A1 | 10/2014 | Ng et al. | |
| 2017/0180620 A1 | 6/2017 | Takasumi et al. | |
| 2018/0167597 A1* | 6/2018 | Seifi | H04N 11/20 |
| 2018/0322393 A1* | 11/2018 | Pau | G06N 3/088 |

OTHER PUBLICATIONS

Basterrech et al., "Self-Organizing Maps and Scale-Invariant Maps in Echo State Networks," 11th International Conference on Intelligent Systems Design and Applications, IEEE, Cordoba, Spain, Nov. 22-24, 2011, pp. 94-99.

Jaeger, "The "echo state" approach to analysing and training recurrent neural networks—with an Erratum note," Jan. 26, 2010, corrected version of GMD Report 148, German National Research Center for Information Technology, 2001, 47 pages.

Lukoševičius, "Self-organized reservoirs and their hierarchies," International Conference on Artificial Neural Networks, Berlin, Germany, 2012, pp. 587-595.

Martinetz et al., "'Neural-Gas' Network for Vector Quantization and its Application to Time-Series Prediction," *IEEE Transactions on Neural Networks* 4(4):558-569, 1993.

Van der Maaten et al., "Visualizing Data using t-SNE," *Journal of Machine Learning Research* 9:2579-2605, 2008.

Wikipedia, "Distance (Mathematics)," <https://en.wikipedia.org/wiki/Distance>, accessed via the internet on Apr. 27, 2018, 9 pages.

\* cited by examiner

METHOD OF OPERATING A LEAKY INTEGRATOR, LEAKY INTEGRATOR AND APPARATUS COMPRISING A LEAKY INTEGRATOR

BACKGROUND

Technical Field

The present disclosure relates to a method of operating a leaky integrator, a leaky integrator and an apparatus comprising a leaky integrator.

Description of the Related Art

Some apparatus (e.g., mobile phones, tablet computers, laptop computers, desktop computers, video game consoles, smart card readers, video cameras, televisions, vehicles, etc.) may be equipped with one or more optical sensors to capture images of a scene. These apparatus may be equipped with one or more functions (e.g., white balance control, exposure control, tone mapping control, etc.) to adjust characteristics of the final images (e.g., brightness, dynamic range, contrast, etc.) rendered on a display.

With existing functions a problem may arise when the scene comprises lights flashing periodically (e.g., indicators of a car) with a frequency in the order of 1 Hz or lights entering and leaving periodically (e.g., tunnel with overhead lighting) with a frequency in the order of 1 Hz. Indeed, for such scenes the signals controlling the one or more functions, which depend on the images captured by the optical sensor, may oscillate at a frequency in the order of 1 Hz creating visible artefacts in the final images rendered on the display.

Some apparatus are equipped with one or more leaky integrators to filter the signals controlling the one or more functions and avoid sudden changes. However, conventional leaky integrators only partially attenuate visible artefacts in the final images rendered on the display and therefore do not give entire satisfaction.

BRIEF SUMMARY

According to one aspect, there is provided a method of operating a leaky integrator, comprising: receiving an input signal; generating an output signal by integrating a leaked signal over an integration time, wherein the leaked signal is obtained based on a dampening signal, a leak factor and the input signal; and providing the output signal.

The leaked signal may be obtained by multiplying the dampening signal, the leak factor and a difference signal between the input signal and the output signal.

The leak factor may be fixed over the integration time.

The dampening signal may be variable over the integration time.

The dampening signal may be designed to vary based on the presence of periodic oscillations in the input signal, a duty cycle of the periodic oscillations and/or a frequency of the periodic oscillations.

The dampening signal may be designed to dampen the leaked signal more in the presence of periodic oscillations than in the presence of aperiodic oscillations in the input signal.

The dampening signal may be designed to dampen the leaked signal more in the presence of periodic oscillations in the input signal with a high frequency than in the presence of periodic oscillations in the input signal with a low frequency. That is, the greater the frequency of the periodic oscillations, the greater the dampening of the leaked signal or vice versa. The lower the frequency of the periodic oscillations, the lower the dampening of the leaked signal or vice versa.

The dampening signal may be designed to vary between 0 and 1.

An offset of the dampening signal may vary based on the presence of periodic oscillations in the input signal and/or the duty cycle of the periodic oscillations.

A dampening signal may vary between 0 and $0+\Delta_1$, wherein $\Delta_1$ is lower than 1, when the input signal comprises periodical oscillations; and wherein the dampening signal may vary between $1-\Delta_2$ and 1, wherein $\Delta_2$ is greater than 0, when the input signal comprises aperiodic oscillations.

The closer the duty cycle of the periodic oscillations is to 50%, the lower $\Delta_1$ and therefore the greater the dampening of the input signal may be. The further the duty cycle of the periodic oscillations is to 50%, the greater $\Delta_1$ and therefore the lower the dampening of the input signal may be.

An amplitude of the dampening signal may vary based on the frequency of periodic oscillations present in the input signal.

The greater the frequency of the periodic oscillations, the lower $\Delta_1$ and therefore the greater the dampening of the input signal may be. The lower the frequency of the periodic oscillations, the greater $\Delta_1$ and therefore the lower the dampening of the input signal may be.

The method may comprise: generating an upper difference signal by integrating the difference signal over the integration time when the difference signal is positive; generating a lower difference signal by integrating the difference signal over the integration time when the difference signal is negative; and generating the dampening signal based on the upper intermediate signal and the lower intermediate signal.

Generating the dampening signal based on the upper difference signal and the lower difference signal may be based on:

$$D(n) = 1 - \frac{UpperDiff(n) \times LowerDiff(n)}{\left(\frac{UpperDiff(n) + LowerDiff(n)}{2}\right)^2}$$

wherein D' is the dampening signal, 'UpperDiff' is the upper difference signal and 'LowerDiff' is the lower difference signal.

The output signal may be designed to control a function, such as an exposure control function, a white balance control function or a tone mapping control function.

The dampening signal, the difference signal, the upper difference signal and/or the lower difference signal may be generated on a per frame basis or on a per N frames basis, wherein N is greater than 1.

According to one aspect, there is provided a leaky integrator, comprising means for: receiving an input signal; generating an output signal by integrating a leaked signal over an integration time, wherein the leaked signal is obtained based on a dampening signal, a leak factor and the input signal; and providing the output signal.

The leaked signal may be obtained by multiplying the dampening signal, the leak factor and a difference signal between the input signal and the output signal.

The leak factor may be fixed over the integration time.

The dampening signal may be variable over the integration time.

The dampening signal may be designed to vary based on the presence of periodic oscillations in the input signal, a duty cycle of the periodic oscillations and/or a frequency of the periodic oscillations.

The dampening signal may be designed to dampen the leaked signal more in the presence of periodic oscillations than in the presence of aperiodic oscillations in the input signal.

The dampening signal may be designed to dampen the leaked signal more in the presence of periodic oscillations in the input signal with a high frequency than in the presence of periodic oscillations in the input signal with a low frequency. That is, the greater the frequency of the periodic oscillations, the greater the dampening of the leaked signal or vice versa. The lower the frequency of the periodic oscillations, the lower the dampening of the leaked signal or vice versa.

The dampening signal may be designed to vary between 0 and 1.

An offset of the dampening signal may vary based on presence of periodic oscillations in the input signal and/or the duty cycle of the periodic oscillations.

A dampening signal may vary between 0 and $0+\Delta_1$, wherein $\Delta_1$ is lower than 1, when the input signal comprises periodical oscillations; and wherein the dampening signal may vary between $1-\Delta_2$ and 1, wherein $\Delta_2$ is greater than 0, when the input signal comprises aperiodic oscillations.

The closer the duty cycle of the periodic oscillations is to 50%, the lower $\Delta_1$ and therefore the greater the dampening of the input signal may be. The further the duty cycle of the periodic oscillations is from 50%, the greater $\Delta_1$ and therefore the lower the dampening of the input signal may be.

An amplitude of the dampening signal may vary based on the frequency of periodic oscillations present in the input signal.

The greater the frequency of the periodic oscillations, the lower $\Delta_1$ and therefore the greater the dampening of the input signal may be. The lower the frequency of the periodic oscillations, the greater $\Delta_1$ and therefore the lower the dampening of the input signal may be.

The leaky integrator may comprise means for: generating an upper difference signal by integrating the difference signal over the integration time when the difference signal is positive; generating a lower difference signal by integrating the difference signal over the integration time when the difference signal is negative; and generating the dampening signal based on the upper intermediate signal and the lower intermediate signal.

Generating the dampening signal based on the upper difference signal and the lower difference signal may be based on:

$$D(n) = 1 - \frac{UpperDiff(n) \times LowerDiff(n)}{\left(\frac{UpperDiff(n) + LowerDiff(n)}{2}\right)^2}$$

wherein 'D' is the dampening signal, 'UpperDiff' is the upper difference signal and 'LowerDiff' is the lower difference signal.

The output signal may be designed to control a function, such as an exposure control function, a white balance control function or a tone mapping control function.

The dampening signal, the difference signal, the upper difference signal and/or the lower difference signal may be generated on a per frame basis or on a per N frames basis, wherein N is greater than 1.

According to an aspect there is provided leaky integrator comprising at least one processor and at least one memory including computer code for one or more programs, the at least one memory and the computer code configured, with the at least one processor, to cause the leaky integrator at least to: receive an input signal; generate an output signal by integrating a leaked signal over an integration time, wherein the leaked signal is obtained based on a dampening signal, a leak factor and the input signal; and provide the output signal.

The leaked signal may be obtained by multiplying the dampening signal, the leak factor and a difference signal between the input signal and the output signal.

The leak factor may be fixed over the integration time.

The dampening signal may be variable over the integration time.

The dampening signal may be designed to vary based on the presence of periodic oscillations in the input signal, a duty cycle of the periodic oscillations and/or a frequency of the periodic oscillations.

The dampening signal may be designed to dampen the leaked signal more in the presence of periodic oscillations than in the presence of aperiodic oscillations in the input signal.

The dampening signal may be designed to dampen the leaked signal more in the presence of periodic oscillations in the input signal with a high frequency than in the presence of periodic oscillations in the input signal with a low frequency. That is, the greater the frequency of the periodic oscillations, the greater the dampening of the leaked signal or vice versa. The lower the frequency of the periodic oscillations, the lower the dampening of the leaked signal or vice versa.]

The dampening signal may be designed to vary between 0 and 1.

An offset of the dampening signal may vary based on the presence of periodic oscillations in the input signal and/or the duty cycle of the periodic oscillations.

A dampening signal may vary between 0 and $0+\Delta_1$, wherein $\Delta_1$ is lower than 1, when the input signal comprises periodical oscillations; and wherein the dampening signal may vary between $1-\Delta_2$ and 1, wherein $\Delta_2$ is greater than 0, when the input signal comprises aperiodic oscillations.

The closer the duty cycle of the periodic oscillations is to 50%, the lower $\Delta_1$ and therefore the greater the dampening of the input signal may be. The further the duty cycle of the periodic oscillations is to 50%, the greater $\Delta_1$ and therefore the lower the dampening of the input signal may be.

An amplitude of the dampening signal may vary based on the frequency of periodic oscillations present in the input signal.

The greater the frequency of the periodic oscillations, the lower $\Delta_1$ and therefore the greater the dampening of the input signal may be. The lower the frequency of the periodic oscillations, the greater $\Delta_1$ and therefore the lower the dampening of the input signal may be.

The at least one memory and the computer code may be configured, with the at least one processor, to cause the leaky integrator at least to: generate an upper difference signal by integrating the difference signal over the integration time when the difference signal is positive; generate a lower difference signal by integrating the difference signal over the integration time when the difference signal is negative; and generate the dampening signal based on the upper intermediate signal and the lower intermediate signal.

Generating the dampening signal based on the upper difference signal and the lower difference signal may be based on:

$$D(n) = 1 - \frac{UpperDiff(n) \times LowerDiff(n)}{\left(\frac{UpperDiff(n) + LowerDiff(n)}{2}\right)^2}$$

wherein 'D' is the dampening signal, 'UpperDiff' is the upper difference signal and 'LowerDiff' is the lower difference signal.

The output signal may be designed to control a function, such as an exposure control function, a white balance control function or a tone mapping control function.

The dampening signal, the difference signal, the upper difference signal and/or the lower difference signal may be generated on a per frame basis or on a per N frames basis, wherein N is greater than 1.

According to one aspect, there is provided an apparatus comprising: an optical sensor; and any of the above leaky integrator.

The apparatus may comprise a mobile phone, a tablet computer, a desktop computer, a laptop computer, a video game console, a video door, a smart watch, a vehicle or the like.

According to an aspect there is provided a computer program comprising computer executable code which when run on at least one processor is configured to receive an input signal; generate an output signal by integrating a leaked signal over an integration time, wherein the leaked signal is obtained based on a dampening signal, a leak factor and the input signal; and provide the output signal.

The leaked signal may be obtained by multiplying the dampening signal, the leak factor and a difference signal between the input signal and the output signal.

The leak factor may be fixed over the integration time.

The dampening signal may be variable over the integration time.

The dampening signal may be designed to vary based on the presence of periodic oscillations in the input signal, a duty cycle of the periodic oscillations and/or a frequency of the periodic oscillations.

The dampening signal may be designed to dampen the leaked signal more in the presence of periodic oscillations than in the presence of aperiodic oscillations in the input signal.

The dampening signal may be designed to dampen the leaked signal more in the presence of periodic oscillations in the input signal with a high frequency than in the presence of periodic oscillations in the input signal with a low frequency. That is, the greater the frequency of the periodic oscillations, the greater the dampening of the leaked signal or vice versa. The lower the frequency of the periodic oscillations, the lower the dampening of the leaked signal or vice versa.

The dampening signal may be designed to vary between 0 and 1.

An offset of the dampening signal may vary based on the presence of periodic oscillations in the input signal and/or the duty cycle of the periodic oscillations.

A dampening signal may vary between 0 and $0+\Delta_1$, wherein $\Delta_1$ is lower than 1, when the input signal comprises periodical oscillations; and wherein the dampening signal may vary between $1-\Delta_2$ and 1, wherein $\Delta_2$ is greater than 0, when the input signal comprises aperiodic oscillations.

The closer the duty cycle of the periodic oscillations is to 50%, the lower $\Delta_1$ and therefore the greater the dampening of the input signal may be. The further the duty cycle of the periodic oscillations is to 50%, the greater $\Delta_1$ and therefore the lower the dampening of the input signal may be.

An amplitude of the dampening signal may vary based on the frequency of periodic oscillations present in the input signal.

The greater the frequency of the periodic oscillations, the lower $\Delta_1$ and therefore the greater the dampening of the input signal may be. The lower the frequency of the periodic oscillations, the greater $\Delta_1$ and therefore the lower the dampening of the input signal may be.

The computer program comprising computer executable code which when run on at least one processor may be configured to: generate an upper difference signal by integrating the difference signal over the integration time when the difference signal is positive; generate a lower difference signal by integrating the difference signal over the integration time when the difference signal is negative; and generate the dampening signal based on the upper intermediate signal and the lower intermediate signal.

Generating the dampening signal based on the upper difference signal and the lower difference signal may be based on:

$$D(n) = 1 - \frac{UpperDiff(n) \times LowerDiff(n)}{\left(\frac{UpperDiff(n) + LowerDiff(n)}{2}\right)^2}$$

wherein 'D' is the dampening signal, 'UpperDiff' is the upper difference signal and 'LowerDiff' is the lower difference signal.

The output signal may be designed to control a function, such as an exposure control function, a white balance control function or a tone mapping control function.

The dampening signal, the difference signal, the upper difference signal and/or the lower difference signal may be generated on a per frame basis or on a per N frames basis, wherein N is greater than 1.

According to an aspect, there is provided a computer readable medium comprising program instructions stored thereon for performing at least one of the above methods.

According to an aspect, there is provided a non-transitory computer readable medium comprising program instructions stored thereon for performing at least one of the above methods.

According to an aspect, there is provided a non-volatile tangible memory medium comprising program instructions stored thereon for performing at least one of the above methods.

In the above, many different aspects have been described. It should be appreciated that further aspects may be provided by the combination of any two or more of the aspects described above.

Various other aspects are also described in the following detailed description and in the attached claims.

BRIEF DESCRIPTION OF THE SEVERAL
VIEWS OF THE DRAWINGS

Reference will now be made, by way of example only, to the accompanying drawings in which.

DETAILED DESCRIPTION

Figure 1:
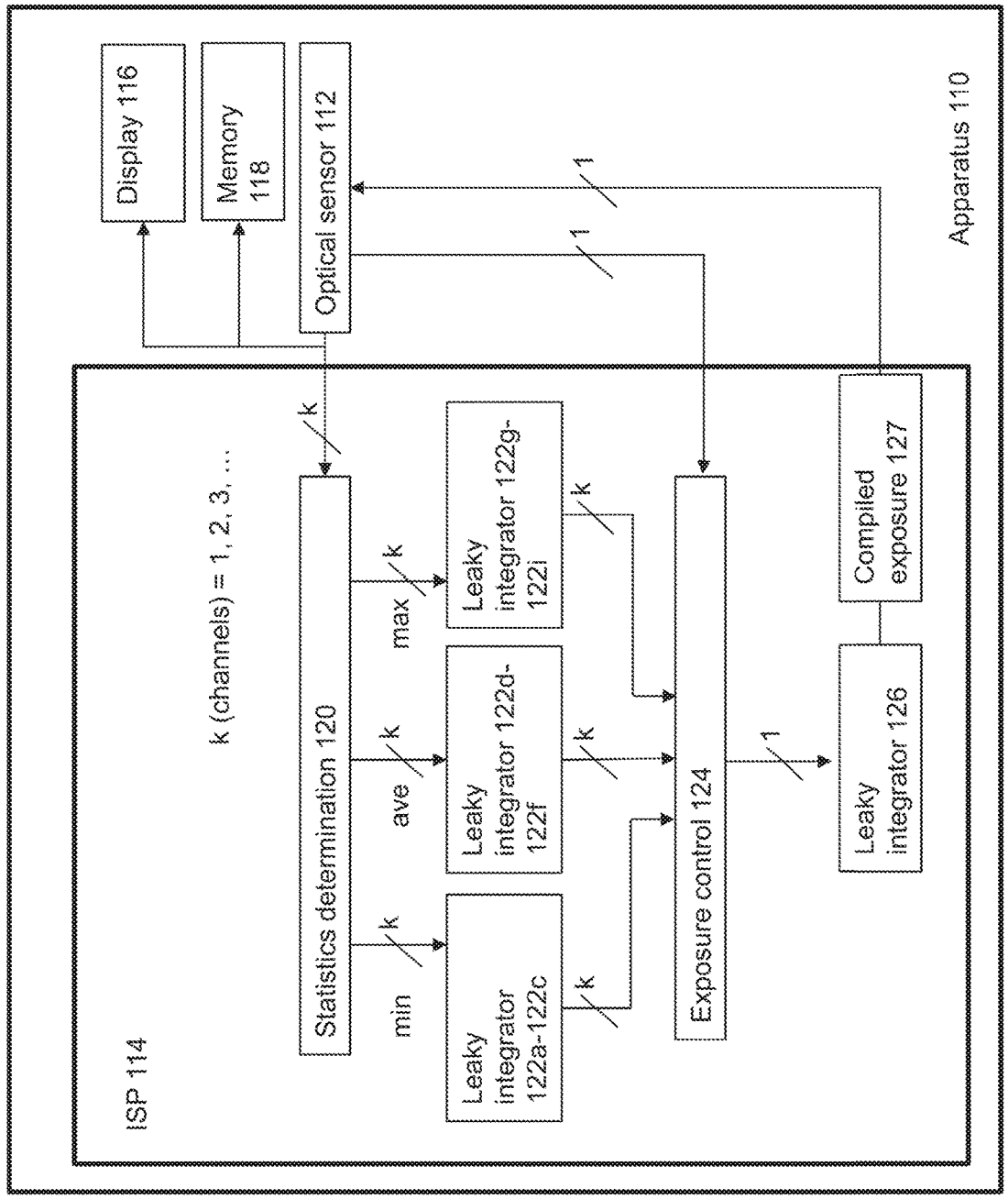
FIG. 1 shows a schematic representation of an apparatus comprising leaky integrators configured to filter signals controlling an exposure control function.

FIG. 1 shows a schematic representation of an apparatus 110. The apparatus 110 may comprise a mobile phone, a tablet computer, a desktop computer, a laptop computer, a video game console, a video door, a smart watch, a vehicle or the like.

The apparatus 110 may comprise an optical sensor 112 (e.g., digital camera) configured to capture images of a scene. Each image may comprise one or more channels, such as a red channel, a green channel and a blue channel. Each image may be characterized by one or more characteristics, such as a brightness, a dynamic range, a contrast, a resolution or other characteristics. Each characteristic may be adjusted by one or more parameters of the optical sensor 112, such as an exposure parameter, a shutter speed parameter, a channel gain parameter, a channel curve parameter or other parameters.

The apparatus 110 may comprise an image signal processor (ISP) 114 configured to process the images of the scene captured by the optical sensor 112.

The apparatus 110 may comprise a display 116 configured to render the images of the scene captured by the optical sensor 112.

The apparatus 110 may comprise a memory 118 configured to store the images of the scene captured by the optical sensor 112. Additionally or alternatively, the memory 118 may be configured to store instructions which when executed by the image signal processor 114 allow the image signal processor 114 to perform some or all of the steps of the methods described hereafter. The memory 118 may comprise any suitable means for storing information, such as instructions and/or data (to be processed or having been processed). These means may for example be random access memory (RAM) and/or a read only memory (ROM) or any suitable variety thereof.

The image signal processor 114 may comprise a statistics determination function 120, primary leaky integrators 122a to 122i, an exposure control function 124, a secondary leaky integrator 126 and a compiled exposure function 127.

The statistics determination function 120 may be configured to receive images captured by the optical sensor 112 and to determine statistics on one or more characteristics of the images or parameters of the optical sensor based thereon. The statistics may be determined on a per image basis or on a per N images basis, wherein N is greater than 1. The statistics may comprise a minimum value, an average value, a maximum value or other statistics of an image characteristic or an optical sensor parameter. The statistics may be provided per channel. For example, a minimum value, an average value, a maximum value may be determined for the red channel. A minimum value, an average value, a maximum value may be determined for the green channel. A minimum value, an average value, a maximum value may be determined for the blue channel.

The statistics determination function 120 may be configured to provide the statistics to the primary leaky integrators 122a to 122i. For example, the minimum value for the red channel, the minimum value for the green channel and the minimum value for the blue channel may be respectively provided to the primary leaky integrator 122a to 122c. The average value for the red channel, the average value for the green channel and the average value for the blue channel may be respectively provided to the primary leaky integrator 122d to 122f. The maximum value for the red channel, the maximum value for the green channel and the maximum value for the blue channel may be respectively provided to the primary leaky integrator 122g to 122i.

The primary leaky integrators 122a to 122i may be configured to filter the statistics to avoid sudden/sharp changes. The primary leaky integrators 122a to 122i may be configured to provide the filtered statistics to the exposure control function 124. Possible implementations of the primary leaky integrators 122a to 122i will be described in more details in reference to FIG. 4 and FIG. 7.

The exposure control function 124 may be configured to determine a subsequent aperture parameter to be used by the optical sensor to capture a subsequent image of the scene based on the filtered statistics received from the primary leaky integrators 122a to 122i and a current aperture parameter received from the optical sensor 122 used by the optical sensor to capture a current image of the scene (i.e., from which are derived the statistics). The exposure control function 124 may be configured to provide the subsequent aperture parameter to the secondary leaky integrator 126.

The secondary leaky integrator 126 may be configured to filter the subsequent aperture parameter to further avoid sudden/sharp changes. The secondary leaky integrator 126 may be configured to provide the filtered subsequent aperture parameter to the compiled exposure function 127. The compiled exposure function 127 may translate the desired aperture parameter, e.g., the filtered subsequent aperture parameter, into specific settings available for the optical sensor 112. Possible implementations of the secondary leaky integrator 126 will be described in more details in reference to FIG. 4 and FIG. 7.

It will be understood that the statistics determination function 120, primary leaky integrators 122a to 122i, exposure control function 124, secondary leaky integrator 126 and compiled exposure function 127 are not necessarily all part of the image signal processor 114. In some embodiments, some or all of the primary leaky integrators 122a to 122i, exposure control function 124, secondary leaky integrator 126 and compiled exposure function 127 may be part of the optical sensor 112 or may be outside of both the optical sensor 112 and the image signal processor 114.

It will also be understood that the statistics determination function 120, primary leaky integrators 122a to 122i, exposure control function 124, secondary leaky integrator 126 and compiled exposure function 127 may be implemented in software but are not necessarily implemented in software. The statistics determination function 120, primary leaky integrators 122a to 122i, exposure control function 124, secondary leaky integrator 126 and compiled exposure function 127 each may be implemented in hardware, software, or in a combination of electronic hardware and software running on suitable processors.

In operation, the control of the exposure parameter of the optical sensor 112 may allow to adapt the image captured by the optical sensor 112 to the dynamic range of the scene. A plurality of images of the same scene may be captured by the optical sensor 112 with respective exposure parameter. The plurality of images may be merged to form one High Dynamic Range (HDR) image. There is a trade-off between capturing the full dynamic of the scene (e.g., the brightest parts of the scene) without clipping whilst maintaining good signal-to-noise (SNR) performance in dark regions of the scene.

Images captured by the optical sensor 112 are passed to the image signal processor 114. Statistics of the images are determined. These statistics may be subject to rapid changes as the illumination source changes (e.g., sunlight to shadow, from tunnel-lighting to sunlight) or other characteristics of the scene change. Selecting the exposure parameter for each image may be subject to continual trade-off, but rapid change from one exposure parameter to another is never visually satisfying. Therefore, statistics are subject to smoothing by the primary leaky integrators 122a to 122i. The smoothed statistics are then used to determine the exposure parameter for the next image which changes gradually in order to adapt to changing characteristics of the scene. The exposure parameter may then be subject to the secondary leaky integrator 126 to further smooth the exposure parameter.

Figure 2:
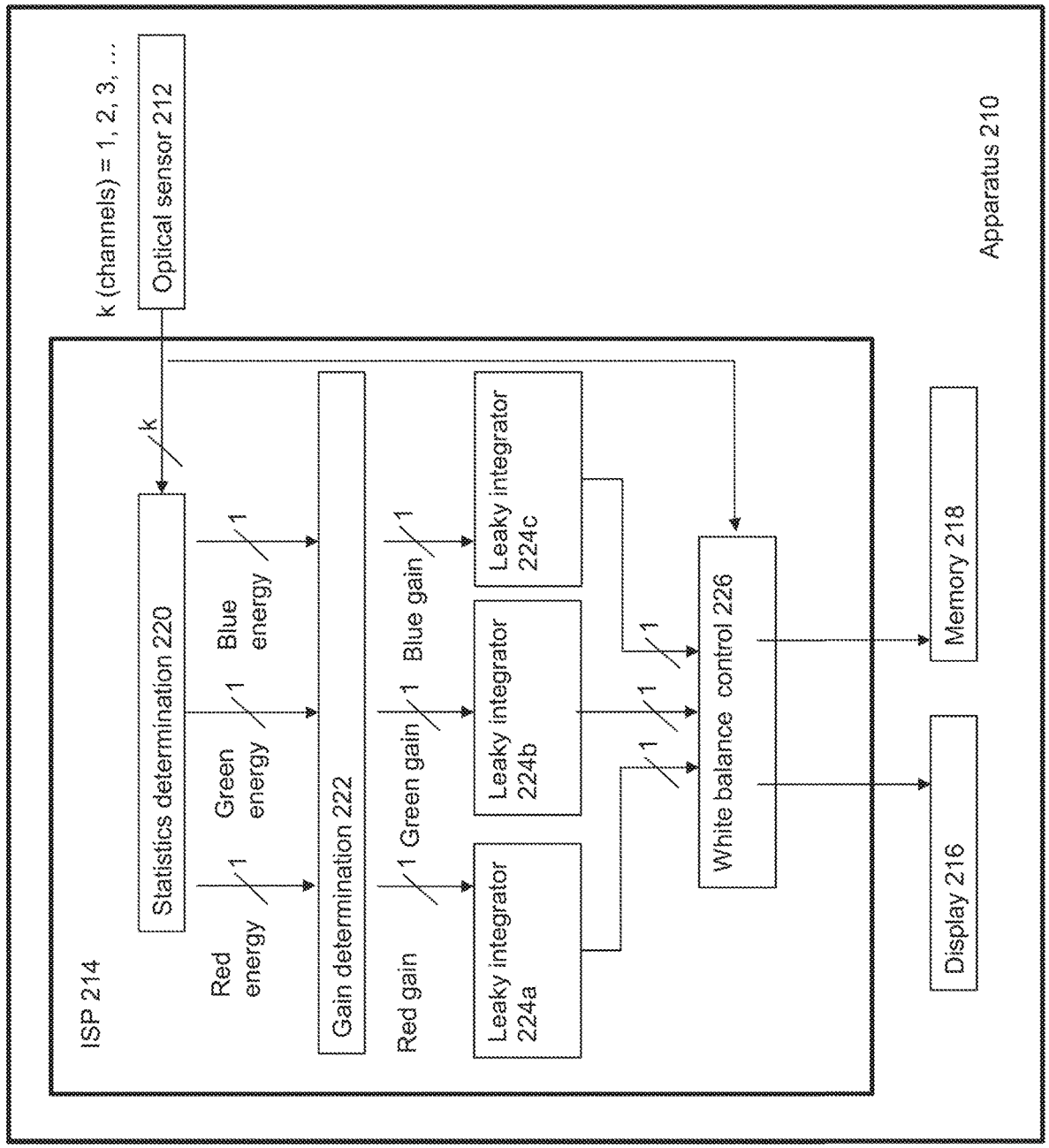
FIG. 2 shows a schematic representation of an apparatus comprising leaky integrators configured to filter signals controlling a white balance control function.

FIG. 2 shows a schematic representation of an apparatus 210. The apparatus 210 may comprise a mobile phone, a tablet computer, a desktop computer, a laptop computer, a video game console, a video door, a smart watch, a vehicle or the like.

The apparatus 210 may comprise an optical sensor 212 (e.g., digital camera) configured to capture images of a scene. Each image may comprise one or more channels, such as a red channel, a green channel and a blue channel. Each image may be characterized by one or more characteristics, such as a brightness, a dynamic range, a contrast, a resolution or other characteristics. Each characteristic may be adjusted by adjusting one or more parameters of the optical sensor 212, such as an exposure parameter, a shutter speed parameter, a channel gain parameter, a channel curve parameter or other parameters.

The apparatus 210 may comprise an image signal processor (ISP) 214 configured to process the images of the scene captured by the optical sensor 212.

The apparatus 210 may comprise a display 216 configured to render the images of the scene captured by the optical sensor 212 and processed by the image signal processor 214.

The apparatus 210 may comprise a memory 218 configured to store the images of the scene captured by the optical sensor 212 and processed by the image signal processor 214. Additionally or alternatively, the memory 218 may be configured to store instructions which when executed by the image signal processor 214 allow the image signal processor 214 to perform some or all of the steps of the methods described hereafter. The memory 218 may comprise any suitable means for storing information, such as instructions and/or data (to be processed or having been processed). These means may for example be random access memory (RAM) and/or a read only memory (ROM) or any suitable variety thereof.

The image signal processor 214 may comprise a statistics determination function 220, a gain determination function 222, leaky integrators 224a to 222c and a white balance control function 226.

The statistics determination function 220 may be configured to receive images captured by the optical sensor 212 and to determine statistics based thereon. The statistics may be determined on a per image basis or on a per N images basis, wherein N is greater than 1. The statistics may comprise an energy or a total intensity. The statistics may be provided per channel. For example, an energy or a total intensity may be determined for the red channel. An energy or a total intensity may be determined for the green channel. An energy or a total intensity may be determined for the blue channel.

The statistics determination function 220 may be configured to provide the statistics to the gain determination function 222.

The gain determination function 222 may be configured to determine gains based on the statistics. For example, a red gain may be determined based on the energy or a total intensity for the red channel. A green gain may be determined based on the energy or a total intensity for the green channel. A blue gain may be determined based on the energy or a total intensity for the blue channel.

The gain determination function 222 may be configured to provide the gains to the leaky integrators 224a to 224c. For example, the red gain may be provided to the leaky integrator 224a. The green gain may be provided to the leaky integrator 224b. The blue gain may be provided to the leaky integrator 224c.

The leaky integrators 224a to 224c may be configured to filter the gains to avoid sudden/sharp changes. The leaky integrators 224a to 224c may be configured to provide the filtered gains to the white balance control function 226. Possible implementations of the leaky integrators 224a to 224c will be described in more details in reference to FIG. 4 and FIG. 7.

The white balance control function 226 may be configured to apply the filtered gains to the image captured by the optical sensor 212 to form a white balanced image. For example, the filtered red gain may be applied to the red channel of the image captured by the optical sensor 210. The filtered green gain may be applied to the green channel of the image captured by the optical sensor 210. The filtered blue gain may be applied to the blue channel of the image captured by the optical sensor 210.

The white balance control function 226 may be configured to provide the white balanced image to the display 216 and/or the memory 218.

It will be understood that the statistics determination function 220, gain determination function 222, leaky integrators 224a to 224c and white balance control function 226 are not necessarily all part of the image signal processor 214. In some embodiments, some or all of the statistics determination function 220, gain determination function 222, leaky integrator 224a to 224c and white balance control function 226 may be part of the optical sensor 212. For example, in an implementation the white balance control function 226 may be part of the optical sensor 212. Some or all of the statistics determination function 220, gain determination function 222, leaky integrator 224a to 224c and white balance control function 226 may also be outside to both the image signal processor 214 and the optical sensor 212.

It will also be understood that the statistics determination function 220, gain determination function 222, leaky integrators 224a to 224c and white balance control function 226 may be implemented in software but are not necessarily implemented in software. The statistics determination function 220, gain determination function 222, leaky integrators 224a to 224c and white balance control function 226 may be implemented in software, hardware or in a combination of electronic hardware and software running on suitable processors.

In operation, the white balance control function 226 may be performed to adapt to changes in illumination sources. Illumination sources may comprise sunlight, tungsten bulb, fluorescent or other illumination sources. Each illumination source may have an associated spectral content which causes a color cast on the image captured by the optical sensor 212.

Images captured by the optical sensor 212 are passed to the image signal processor 214. Statistics are determined. These statistics may be subject to rapid changes as the illumination source changes (e.g., sunlight to shadow, from tunnel-lighting to sunlight) or other characteristics of the scene change. The white balancing may be achieved by applying the red gain, the green gain and the blue gain to the red channel, the green channel or the blue channel, either at the image signal processor 214 or at the optical sensor 212. Rapid changes from one set of red, green and blue gains to another may not be visually satisfying. Therefore red, green and blue gains may be filtered by the leaky integrator 224a to 224c.

Figure 3:
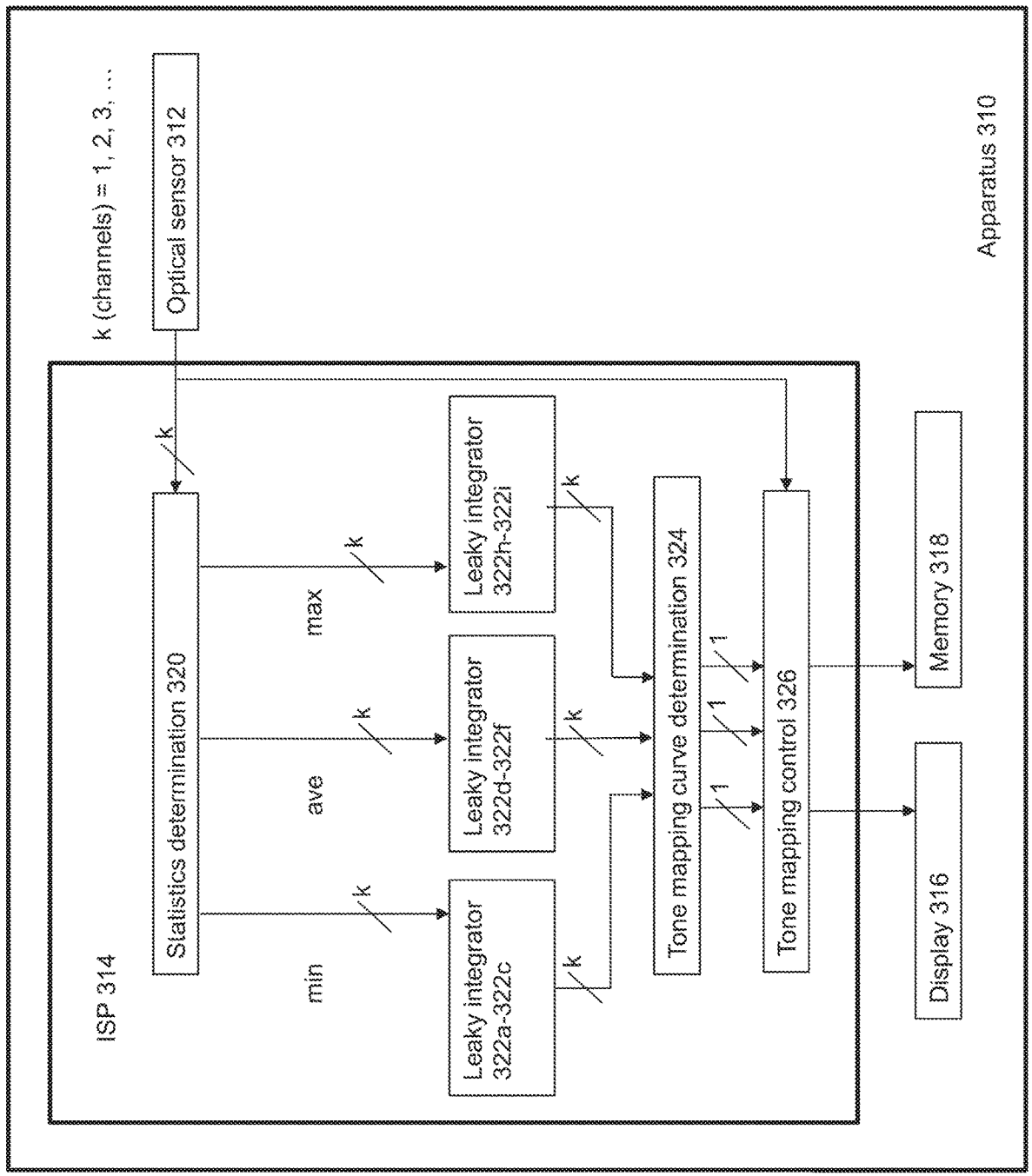
FIG. 3 shows a schematic representation of an apparatus comprising leaky integrators configured to filter signals controlling a tone mapping control function.

FIG. 3 shows a schematic representation of an apparatus 310. The apparatus 310 may comprise a mobile phone, a tablet computer, a desktop computer, a laptop computer, a video game console, a video door, a smart watch, a vehicle or the like.

The apparatus 310 may comprise an optical sensor 312 (e.g., digital camera) configured to capture images of a scene. Each image may comprise one or more channels, such as a red channel, a green channel and a blue channel. Each image may be characterized by one or more characteristics, such as brightness, a dynamic range, a contrast, a resolution or other characteristics. Each characteristic may be adjusted by adjusting one or more parameters of the optical sensor 212, such as an exposure parameter, a shutter speed parameter, a channel gain parameter, a channel curve parameter or other parameters.

The apparatus 310 may comprise an image signal processor (ISP) 314 configured to process the images of the scene captured by the optical sensor 312.

The apparatus 310 may comprise a display 316 configured to render the images of the scene captured by the optical sensor 312 and processed by the image signal processor 314.

The apparatus 310 may comprise a memory 318 configured to store the images of the scene captured by the optical sensor 312 and processed by the image signal processor 314. Additionally or alternatively, the memory 318 may be configured to store instructions which when executed by the image signal processor 314 allow the image signal processor 314 to perform some or all of the steps of the methods described hereafter. The memory 318 may comprise a random access memory (RAM) and/or a read only memory (ROM).

The image signal processor 314 may comprise a statistics determination function 320, leaky integrators 322a to 322i, a tone mapping curve determination function 324 and a tone mapping control function 326.

The statistics determination function 320 may be configured to receive an image captured by the optical sensor 312 and to determine statistics based thereon. The statistics may be determined on a per image basis or on a per N images basis, wherein N is greater than 1. The statistics may comprise a minimum value, an average value, a maximum value or other statistics. The statistics may be provided per channel. For example, a minimum value, an average value, a maximum value may be determined for the red channel. A minimum value, an average value, a maximum value may be determined for the green channel. A minimum value, an average value, a maximum value may be determined for the blue channel.

The statistics determination function 320 may be configured to provide the statistics to the leaky integrators 322a to 322i. For example, the minimum value for the red channel, the minimum value for the green channel and the minimum value for the blue channel may be respectively provided to the leaky integrator 322a to 322c. The average value for the red channel, the average value for the green channel and the average value for the blue channel may be respectively provided to the primary leaky integrator 322d to 322f. The maximum value for the red channel, the maximum value for the green channel and the maximum value for the blue channel may be respectively provided to the primary leaky integrator 322g to 322i.

The leaky integrators 322a to 322i may be configured to filter the statistics to avoid sudden/sharp changes. The leaky integrators 322a to 322i may be configured to provide the filtered statistics to the tone mapping control function 324. Possible implementations of the leaky integrators 322a to 322i will be described in more details in reference to FIG. 4 and FIG. 7.

The tone mapping curve determination function 324 may be configured to determine one or more tone mapping curves based on the filtered statistics and to provide the provide the tone mapping curves to the tone mapping control function 326. For example, a red tone mapping curve, a green tone mapping curve and a blue tone mapping curve may be determined.

The tone mapping control function 326 may be configured to apply the tone mapping curves to the image captured by the optical sensor 312 to form a compressed representation of the captured dynamic from the optical sensor which preserves the visual impact of the perceived scene. For example, the red tone mapping curve may be applied to the red channel of the image captured by the optical sensor 312. The green tone mapping curve may be applied to the green channel of the image captured by the optical sensor 312. The blue tone mapping curve may be applied to the blue channel of the image captured by the optical sensor 312.

The tone mapping control function 326 may be configured to provide the tone mapped image to the display 316 and/or the memory 318.

It will be understood that the statistics determination function 320, leaky integrators 322a to 322i, tone mapping curve determination function 324 and tone mapping control function 326 are not necessarily all part of the image signal processor 314. In some embodiments, some or all of the statistics determination function 320, leaky integrators 322a to 322i, tone mapping curve determination function 324 and tone mapping control function 326 may be part of the optical sensor 312. For example, in an implementation the tone mapping control function 326 may be part of the optical sensor 312. In some embodiments, some or all of the statistics determination function 320, leaky integrators 322a to 322i, tone mapping curve determination function 324 and tone mapping control function 326 may be outside to both the image signal processor 314 and the optical sensor 312.

It will also be understood that the statistics determination function 320, leaky integrators 322a to 322i, tone mapping curve determination function 324 and tone mapping control function 326 may be implemented in software but are not necessarily implemented in software. The statistics determination function 320, leaky integrators 322a to 322i, tone mapping curve determination function 324 and tone mapping control function 326 each may be implemented in hardware, software or a combination of software and hardware.

In operation, the tone mapping control function 326 may be performed to achieve the best compromise between rendered image quality versus dynamic range of the image captured by the optical sensor 312. Images captured by the optical sensor 312 are passed to the image signal processor 314. Statistics are determined. These statistics may be subject to rapid changes as the illumination source changes (e.g., sunlight to shadow, from tunnel-lighting to sunlight) or other characteristics of the scene change. The tone mapping may be achieved by applying the red tone mapping curve, the green tone mapping curve and the blue tone mapping curve to the red channel, the green channel or the blue channel, either at the image signal processor 314 or at the optical sensor 312. Rapid changes from one set of red tone mapping curve, the green tone mapping curve and the blue tone mapping curve to another is never visually satisfying. Therefore statistics may be filtered by the leaky integrator 322a to 322i to generate a smooth change from one set of red tone mapping curve, the green tone mapping curve and the blue tone mapping curve to another set.

Figure 4:
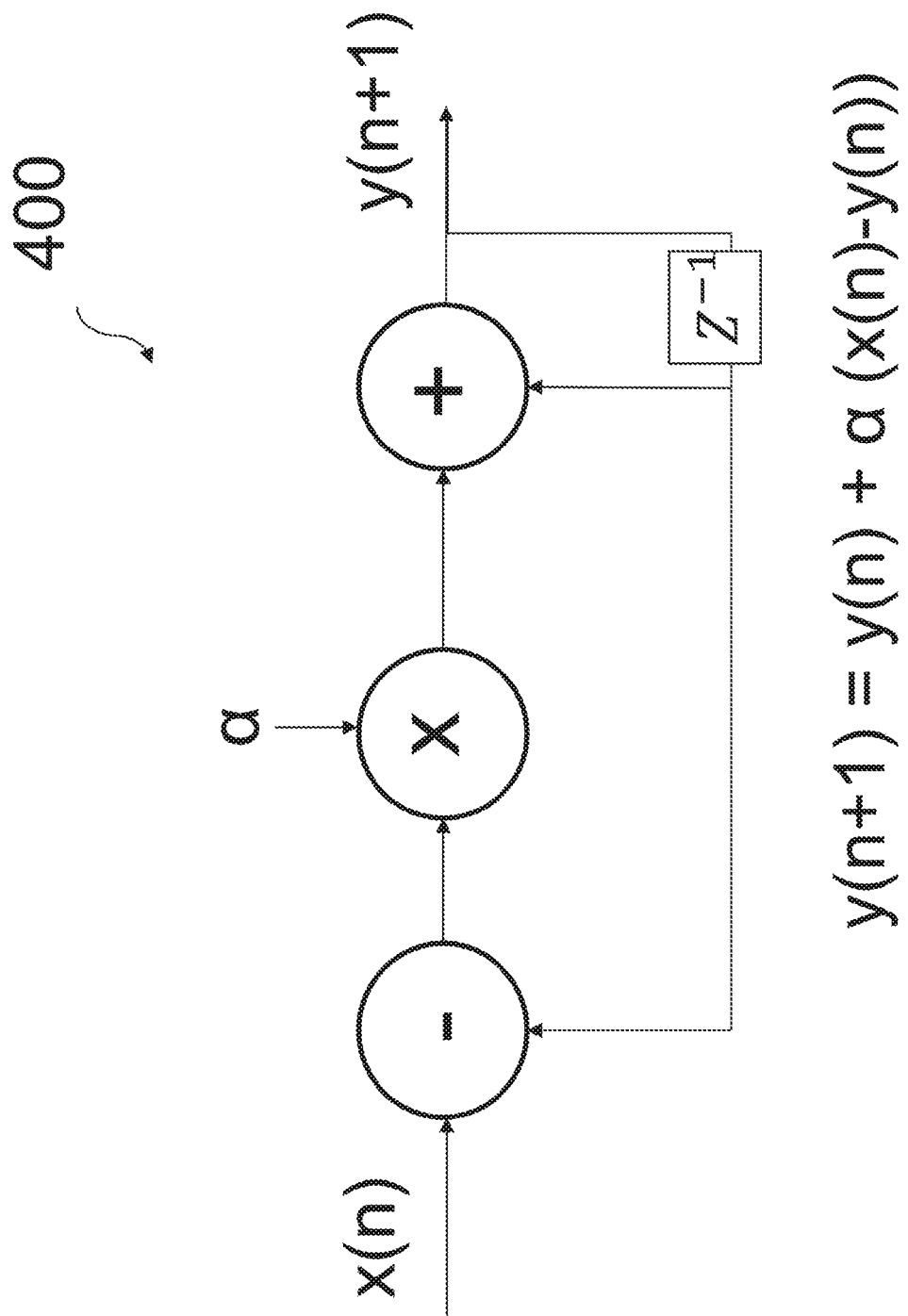
FIG. 4 shows a schematic representation of a leaky integrator wherein a leaked signal is based on a leak factor and a difference between an input signal and an output signal.

FIG. 4 shows an implementation of a leaky integrator 400 wherein an output signal is determined by integrating a leaked signal over an integration time. The leaky integrator may be defined by the following equation, $$y(n+1)=y(n)+L(n) \quad \text{(Equation 1)},$$

wherein 'y' is the output signal with 'y(n)' preceding 'y(n+1)' and 'L' is the leaked signal. It will be understood that y(0) may be set to a predefined value, for example '0'. The integration time is a period of time over which the signal is measured. In an example form, where L(n) is the leaked signal at time n and y(n) is the output signal at time n, then the first output signal at a time (n+1) being y(n+1) means that the integration period is the time period between y(n) and y(n+1). However, it is also possible that a different time period may be used to measure the signal. For example, the first output signal may be at (n+2), (n+3) etc., while the leaked signal and output signal may both still be at time n, e.g., L(n) and y(n).

The leaked signal may be determined based on a leak factor and a difference between an input signal and the output signal. The leak factor may be fixed. The leak factor may be in a range between '0' and '1'. More specifically, the leaked signal may be determined by multiplying the leak factor by the difference signal between the input signal and the output signal. The leaked signal 400 may be defined by the following equations, $$L(n)=\alpha \cdot \text{Diff}(n) \quad \text{(Equation 2)},$$

$$L(n)=\alpha \cdot (n)-y(n)) \quad \text{(Equation 3)},$$

wherein 'L' is the leaked signal, 'α' is the leak factor, Diff is the difference signal, 'x' is the input signal and 'y' is the output signal.

As a result the leaky integrator 400 may be defined by the following equation, $$y(n+1)=y(n)+\alpha \cdot (n)-y(n)) \quad \text{(Equation 4)},$$

wherein 'y' is the output signal, 'α' is the leak factor and 'x' is the input signal.

The leaky integrator 400 forms a low pass filter. Even if the input signal changes suddenly or sharply, the output signal still changes gradually or smoothly depending on the leak factor 'α'.

It will be understood that variations may be provided to the leaky integrator 400. For example, the leaked signal may be determined by multiplying the leak factor by the input signal rather than the difference signal between the input signal and the output signal. The leaked signal may then be defined by the following equations, $$L(n)=\alpha \cdot x(n) \quad \text{(Equation 5)},$$

wherein 'L' is the leaked signal and 'x' is the input signal.

As a result, the leaky integrator may be defined by the following equation, $$y(n+1)=y(n)+a \cdot x(n) \quad \text{(Equation 6)},$$

wherein 'y' is the output signal, 'α' is the leak factor and 'x' is the input signal.

It will be understood that the leaky integrator 400 of FIG. 4 may be implemented in software or in hardware or a combination of software and hardware.

Figure 5:
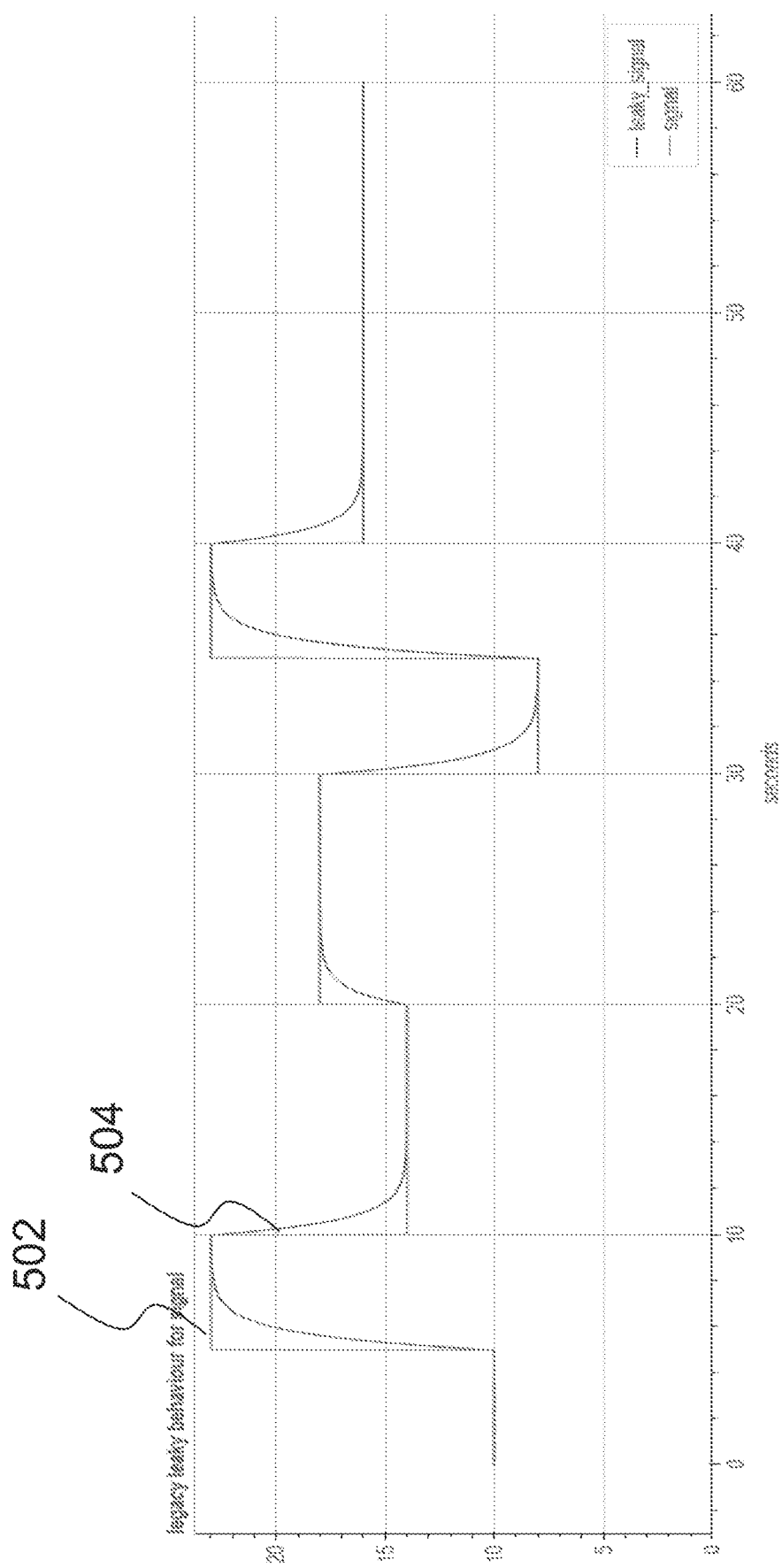
FIG. 5 shows a schematic representation of an input signal and an output signal provided by the leaky integrator of FIG. 4, when the input signal comprise aperiodical oscillations.

FIG. 5 shows a schematic representation of an input signal 502 and an output signal 504 when the input signal 502 is filtered by the leaky integrator 400 of FIG. 4.

The input signal 502 may control a function such as an exposure control function, a white balance control function, a tone mapping control function or another function. As discussed in reference to FIGS. 1 to 3, the input signal may be a statistic (e.g., minimum, average, maximum, energy, total intensity), a gain (red gain, green gain, blue gain) or an exposure.

As can be seen from FIG. 5, the input signal 502 comprises aperiodic/infrequent oscillations. The output signal 504 is more gradual/smoother than the input signal 502 and therefore no artifacts may be visible by the viewer when final images are rendered on a display because the output signal 504 changes quickly but infrequently and over long periods of time (in the order of 10 seconds).

Figure 6:
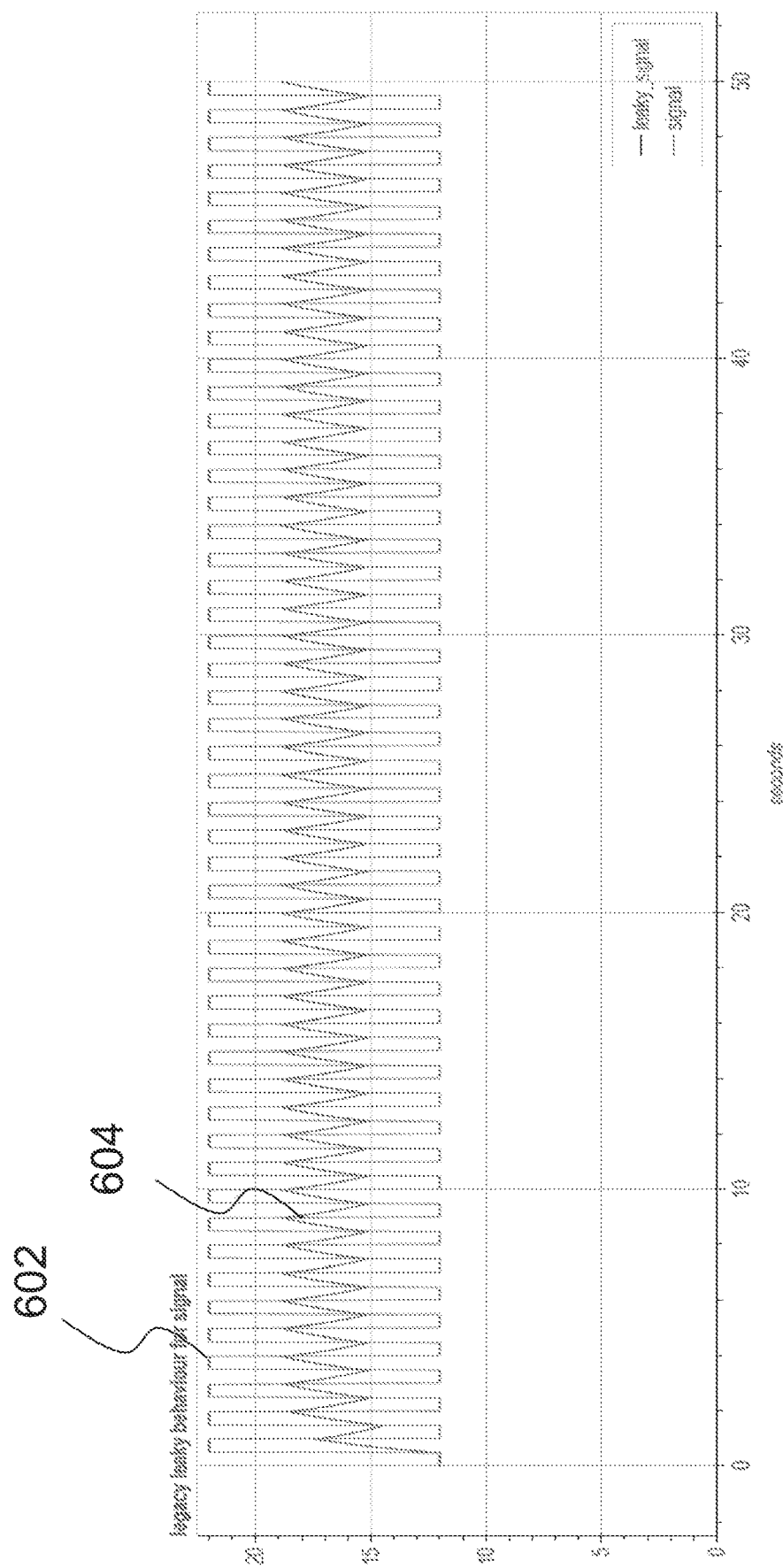
FIG. 6 shows a schematic representation of an input signal and an output signal provided by the leaky integrator of FIG. 4, when the input signal comprises periodical oscillations with a duty cycle of 50%.

FIG. 6 shows a schematic representation of an input signal 602 and an output signal 604 when the input signal 602 is filtered by the leaky integrator 400 of FIG. 4.

As can be seen, the input signal 602 comprises periodic oscillations. For example, the periodic oscillations have a duty cycle of 50% and a frequency of 1 Hz. Such periodic oscillations are typically the consequence of lights flashing in a scene periodically (e.g., indicators of a car) or lights entering and leaving the scene periodically (e.g., tunnel with overhead lighting). The output signal 604 is more gradual/smoother than the input signal 602 but artefacts may still be visible by the viewer when final images are rendered on a display because the output signal 504 changes quickly, frequently and over short periods of time (in the order of 1 second).

A shortcoming of the leaky integrator 400 of FIG. 4, is that it dampens the leaked signal consistently regardless whether the input signal comprises periodic oscillations, regardless the duty cycle of the periodic oscillations and regardless the frequency of the periodic oscillations. As a result, the leaky integrator 400 is not adapted to partially suppress artefacts on final images rendered on a display typically created by lights flashing in a scene periodically (e.g., indicators of a car) or lights entering and leaving the scene periodically (e.g., tunnel with overhead lighting).

One or more of the following examples provide a leaky integrator that dampens the leaked signal selectively based on the presence of periodical oscillations in the input signal, the duty cycle of the periodic oscillations and/or the frequency of the periodic oscillations. As a result, the leaky integrators may more efficiently suppress time varying artefacts on final images rendered on a display.

Figure 7:
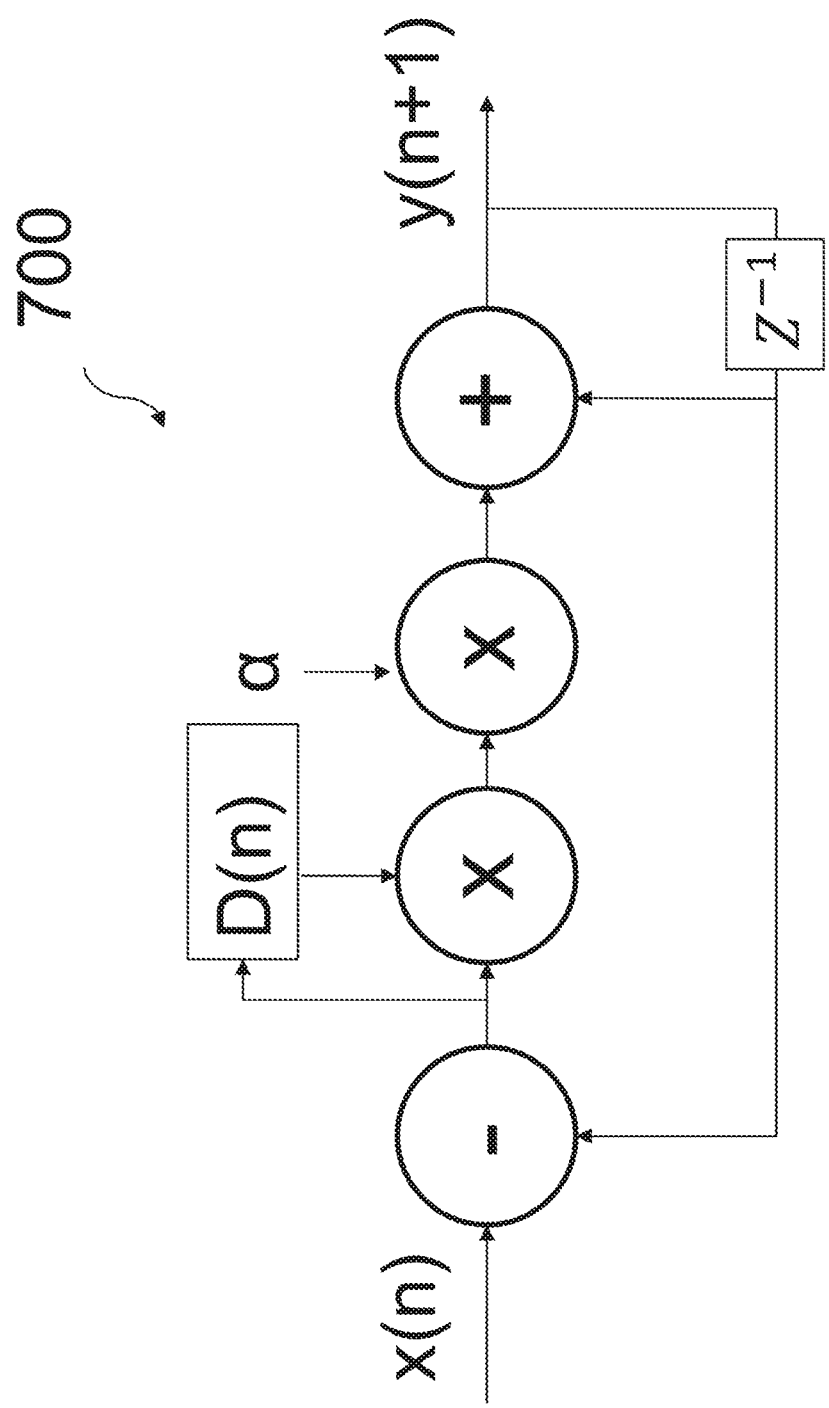
FIG. 7 shows a schematic representation of a leaky integrator wherein a leaked signal is based on a dampening signal, a leak factor and a difference between an input signal and an output signal.

FIG. 7 shows an implementation of a leaky integrator 700 wherein an output signal is determined by integrating a leaked signal over an integration time. The leaky integrator may be defined by the following equation, $$y(n+1)=y(n)+L(n) \quad \text{(Equation 7)},$$

wherein 'y' is the output signal and 'L' is the leaked signal. It will be understood that y(0) may be set to a predefined value, for example '0'.

The leaked signal may be determined based on a dampening signal, a leak factor and a difference signal between an input signal and the output signal. The leak factor may be fixed. The leak factor may be in a range between '0' and '1'. More specifically, the leaked signal may be determined by multiplying the dampening signal, the leak factor and the difference signal between the input signal and the output signal The leaked signal may be defined by the following equations, $$L(n)=D(n)\cdot\alpha\cdot\text{Diff}(n) \quad \text{(Equation 8)},$$

$$L(n)=D(n)\cdot\alpha\cdot(n)-y(n)) \quad \text{(Equation 9)},$$

wherein 'L' is the leaked signal, 'D' is the dampening signal, 'α' is the leak factor, 'Diff' is the difference signal, 'x' is the input signal and 'y' is the output signal.

As a result the leaky integrator 700 may be defined by the following equation, $$y(n+1)=y(n)+D(n)\cdot a\cdot(n)-y(n)) \quad \text{(Equation 10)},$$

wherein 'y' is the output signal, 'D' is the dampening signal, 'α' is the leak factor and 'x' is the input signal.

The dampening signal may be designed to vary based on the presence of periodical oscillations in the input signal, a duty cycle of the periodical oscillations and/or a frequency of the periodical oscillations.

The dampening signal may be designed to dampen the leaked signal more in the presence of periodic oscillations than in the presence of aperiodic oscillations in the input signal.

The dampening signal may dampen the leaked signal more in the presence of periodic oscillations in the input signal with a duty cycle close to 50% than in the presence of periodic oscillations in the input signal with a duty cycle far from 50%. In some embodiments, the closer the duty cycle of the periodic oscillations is to 50%, the greater the dampening of the leaked signal. The further the duty cycle of the periodic oscillations is from 50%, the lower the dampening of the leaked signal.

The dampening signal may be designed to dampen the leaked signal more in the presence of periodic oscillations in the input signal with a high frequency than in the presence of periodic oscillations in the input signal with a low frequency. That is, the greater the frequency of the periodic oscillations, the greater the dampening of the leaked signal or vice versa. The lower the frequency of the periodical oscillations, the lower the dampening of the leaked signal or vice versa. There may be a range of frequency within damping is required and outside which no dampening is required.

In an implementation, the dampening signal may be determined based on an upper difference signal and a lower difference signal. The dampening signal may be defined by the following equation, $$D(n) = 1 - \frac{\text{UpperDiff}(n) \times \text{LowerDiff}(n)}{\left(\frac{\text{UpperDiff}(n) + \text{LowerDiff}(n)}{2}\right)^2}, \quad \text{(Equation 11)}$$

wherein 'D' is the dampening signal, 'UpperDiff' is the upper difference signal and 'LowerDiff' is the lower difference signal.

It will be understood that the dampening signal may be obtained using other suitable equations.

The upper difference signal may be determined by leaky integrating the difference signal between the input signal and the output signal over the integration time but only adding contributions when the difference signal is positive. The upper difference signal may be defined by the following equation, $$\text{UpperDiff}(n)=\text{UpperDiff}(n-1)(1-\beta)+(\beta\cdot\text{Diff}(n)), \text{ if } \text{Diff}(n)>0 \quad \text{(Equation 12)},$$

$$\text{Diff}(n)=x(n)-y(n) \quad \text{(Equation 13)},$$

wherein 'Upperdiff' is the upper difference signal, 'β' is a leak factor, 'Diff' is the difference signal, 'x' is the input signal and 'y' is the output signal. The leak factor may be fixed. The leak factor may be in a range between 0 and 1.

The lower difference signal may be determined by leaky integrating the difference signal between an input signal and an output signal over the integration time but only adding contributions when the difference signal is negative. The lower difference signal may be defined by the following equations, $$\text{LowerDiff}(n)=\text{LowerDiff}(n-1)(1-\beta)-(\beta\cdot\text{Diff}(n)), \text{ if } \text{Diff}(n)<0 \quad \text{(Equation 14)},$$

$$\text{Diff}(n)=x(n)-y(n) \quad \text{(Equation 15)},$$

wherein 'Lowerdiff' is the lower difference signal, 'β' is a leak factor, 'Diff' is the difference signal, 'x' is the input signal and 'y' is the output signal. The leak factor may be fixed. The leak factor may be in a range between 0 and 1.

In the above implementation the dampening signal is designed to vary between 0 and 1.

The imbalance (e.g., offset) of the dampening signal varies based on the presence of periodical oscillations in the input signal. The imbalance (e.g., offset) of the dampening signal may be smaller in the presence of periodic oscillations in the input signal than in the presence of aperiodic oscillations in the input signal. That is, the dampening signal may dampen the leaked signal more in the presence of periodic oscillations than in the presence of aperiodic oscillations.

For example, when the input signal comprises periodical oscillations the dampening signal may vary between 0 and $0+\Delta_1$ whereas when the input signal comprise aperiodic oscillations the dampening signal may vary between $1-\Delta_2$ and 1, wherein $\Delta_1$ is greater than 0 and $\Delta_2$ is lower than 1.

When the input signal comprises periodic oscillations with a duty cycle close to 50%, the dampening signal may vary between 0 and $0+\Delta_{1close}$ whereas when the input signal comprise periodic oscillations with a duty cycle far from 50% the dampening signal may vary between 0 and $0+\Delta_{1far}$, wherein $\Delta_{1close}$ is smaller than $\Delta_{1far}$.

The amplitude of the dampening signal may vary based on the frequency of the periodical oscillations in the input signal. The greater the frequency of the periodic oscillations the lower is the amplitude of the dampening signal. The lower the frequency of the periodic oscillations the greater is the amplitude of the dampening signal.

For example, when the input signal comprises periodic oscillations with a high frequency the dampening signal may vary between 0 and $0+\Delta_{1high\_frequency}$ whereas when the input signal comprises periodic oscillations with a low frequency the dampening signal may vary between 0 and $0+\Delta_{1low\_frequency}$, wherein $\Delta_{1high\_frequency}$ is smaller than $\Delta_{1low\_frequency}$.

In this way, the leaky integrator 700 may more efficiently suppress artifacts on the final images rendered on a display, for example artifacts typically created by lights flashing in a scene periodically (e.g., indicators of a car) or lights entering and leaving the scene periodically (e.g., tunnel with overhead lighting).

It will be understood that alternative implementations may be provided. For example, the leaked signal may be determined by multiplying the leak factor by the input signal rather than the difference signal between the input signal and the output signal. The leaked signal may then be defined by the following equation, $$L(n)=\alpha \cdot x(n) \quad \text{(Equation 16)},$$

wherein 'L' is the leaked signal, 'D' is the dampening signal.

As a result, the leaky integrator may be defined by the following equation, $$y(n+1)=y(n)+D(n)\cdot\alpha\cdot x(n) \quad \text{(Equation 17)},$$

wherein 'y' is the output signal, '$\alpha$' is the leak factor and 'x' is the input signal. It will be understood that y(0) may be set to a predefined value, for example '0'.

It will also be understood that, like the leaky integrator 400 of FIG. 4, the leaky integrator 700 of FIG. 7 may be implemented in software or in hardware or a combination of software and hardware.

Figure 8:
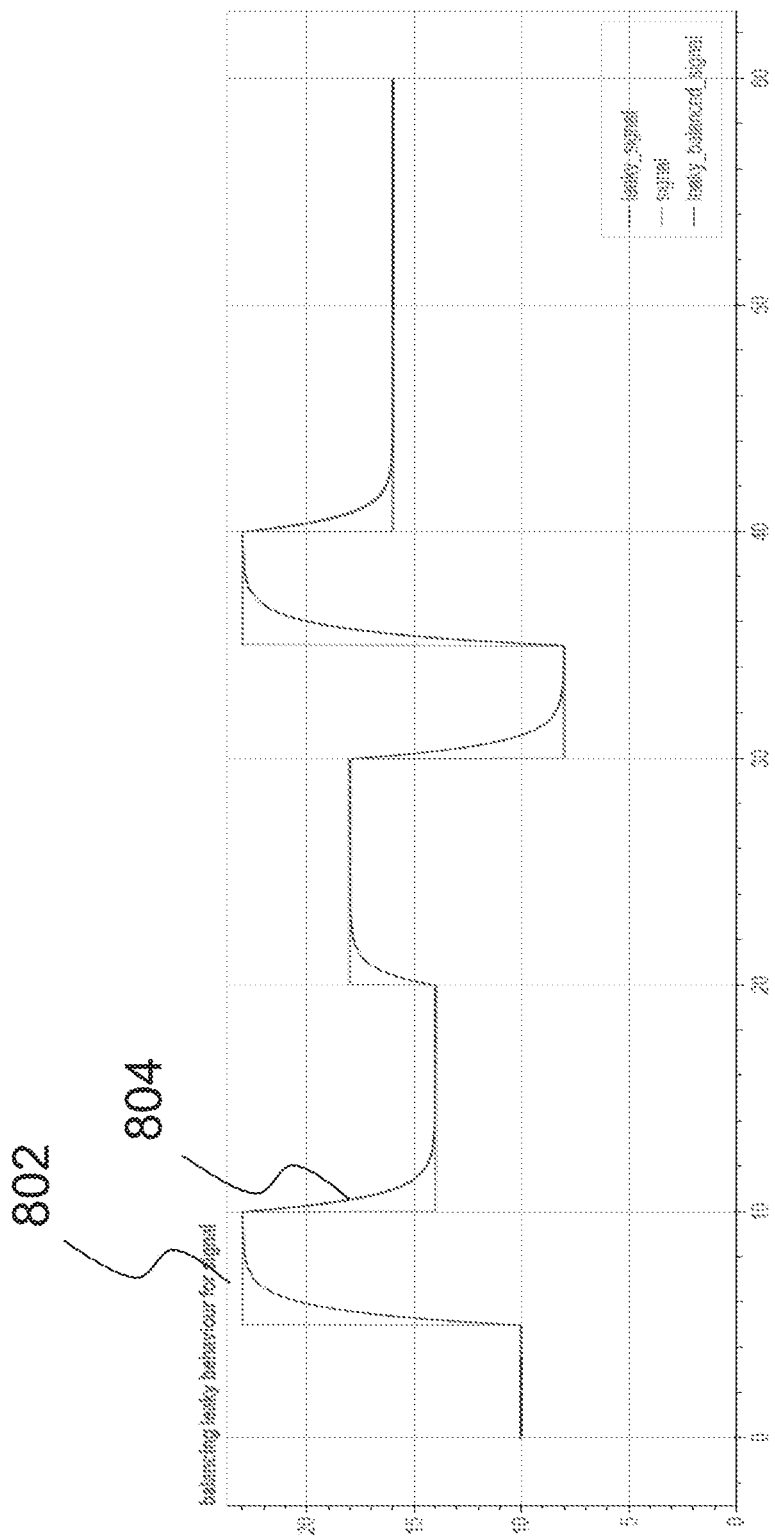
FIG. 8 shows a schematic representation of an input signal and an output signal provided by the leaky integrator of FIG. 7, when the input signal comprise aperiodical oscillations.

FIG. 8 shows a schematic representation of an input signal 802 and an output signal 804 when the input signal 802 is filtered by the leaky integrator 700 of FIG. 7.

As can be seen, the input signal 802 comprises aperiodic oscillations. The output signal 804 is more gradual/smoother than the input signal and no artefacts may be visible by the viewer when final images are rendered on a display because the output signal 804 adapts quickly but infrequently and over a long periods of time (in the order of 10 seconds).

Figure 9:
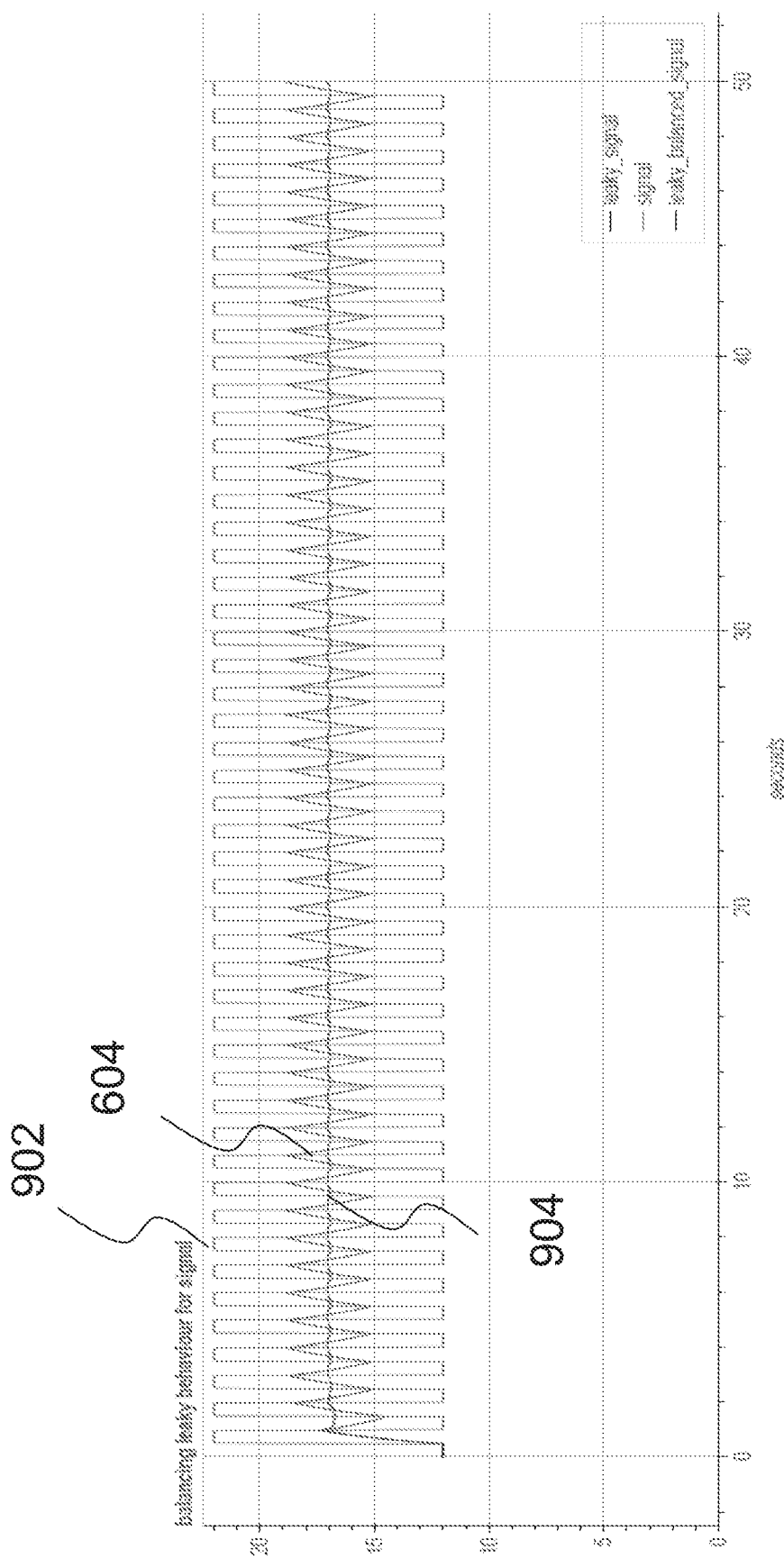
FIG. 9 shows a schematic representation of an input signal and an output signal provided by the leaky integrator of FIG. 7, when the input signal comprises periodical oscillations with a duty cycle of 50%.

FIG. 9 shows a schematic representation of an input signal 902 and an output signal 904 when the input signal 902 is filtered by the leaky integrator 700 of FIG. 7.

As can be seen, the input signal 902 comprises periodic oscillations with a duty cycle of 50%, which are typically the consequence of lights flashing in the scene periodically (e.g., indicators of a car) or lights entering and leaving the scene periodically (e.g., tunnel with overhead lighting). The output signal 904 has no artefacts visible by the viewer when final images are rendered on a display. The output signal 604, filtered by the leaky integrator 400 of FIG. 4, changes frequently and over a short period of time (in the order of 1 second).

Figure 10:
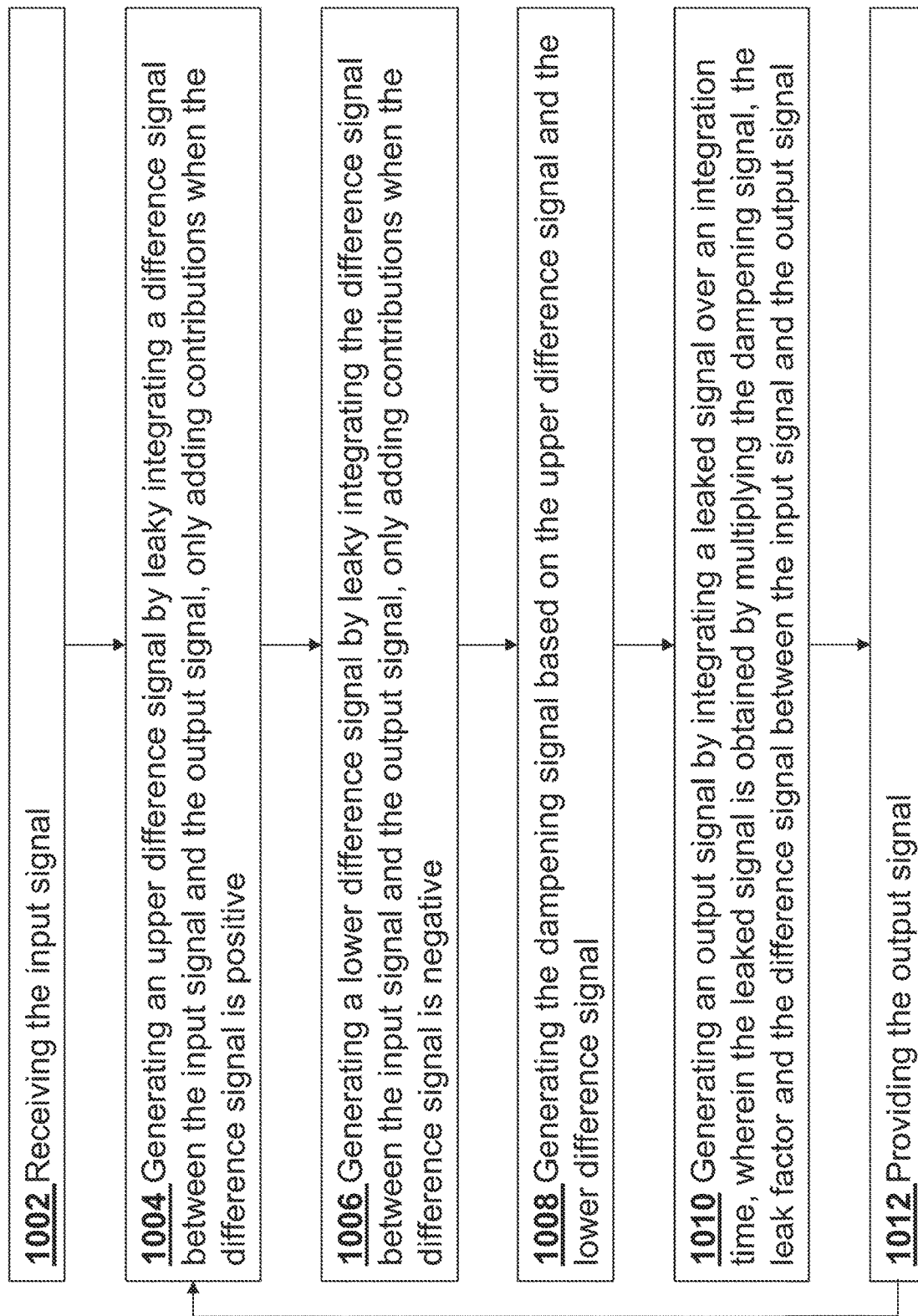
FIG. 10 shows a schematic representation of a method of operating the leaky integrator of FIG. 7.

FIG. 10 shows of a method of operating the leaky integrator 700 of FIG. 7.

In step 1002 the leaky integrator 700 may receive the input signal.

In step 1004 the leaky integrator 700 may generate an upper difference signal by leaky integrating the difference signal between the input signal and the output signal when the difference signal is positive (e.g., Equations 12 and 13).

In step 1006 the leaky integrator 700 may generate a lower difference signal by leaky integrating the difference signal between the input signal and the output signal when the difference signal is negative (e.g., Equations 14 and 15).

In step 1008 the leaky integrator 700 may generate the dampening signal based on the upper difference signal and the lower difference signal (e.g., Equation 10).

In step 1010 the leaky integrator 700 may generate the output signal by integrating the leaked signal over an integration time, wherein the leaked signal is obtained by multiplying the dampening signal, the leak factor and the difference signal between the input signal and the output signal (e.g., Equation 9).

As discussed above, steps 1002 to 1012 may be repeated on a per image basis or on a per N images basis.

Figure 11:
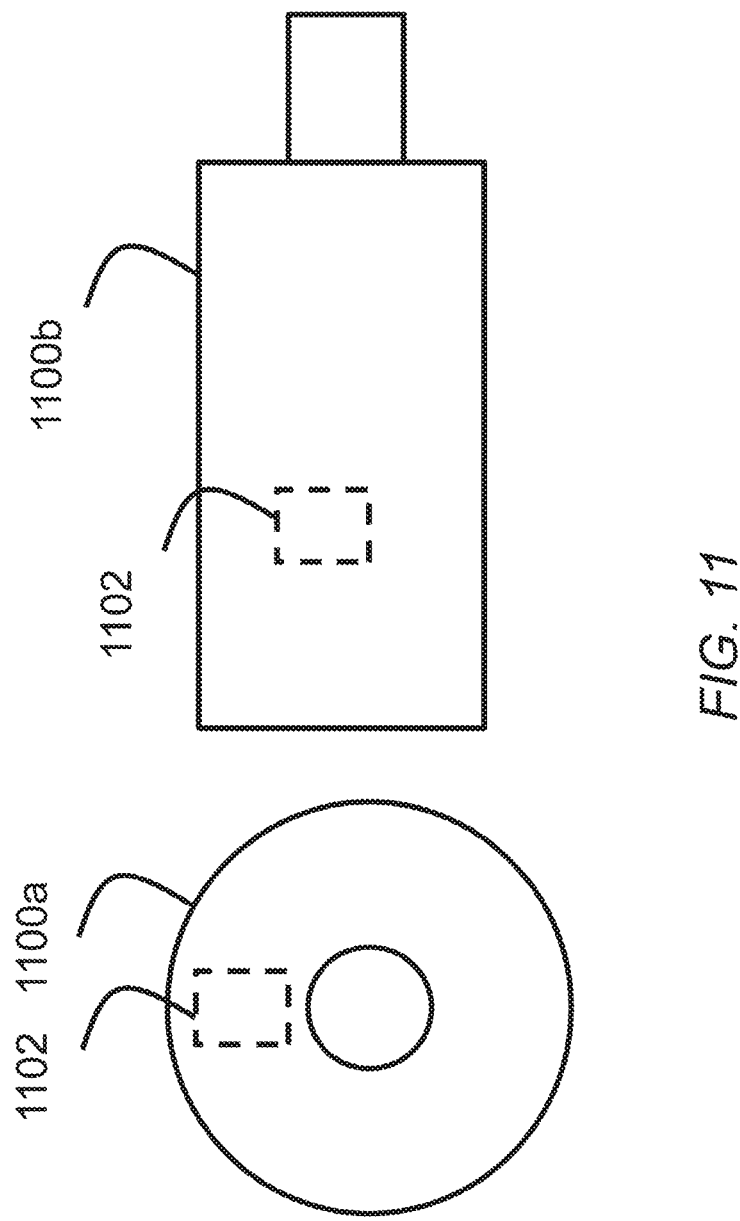
FIG. 11 shows a schematic representation of a non-volatile memory medium storing instructions which when executed by a processor allow a processor to perform one or more of the steps of the method of FIG. 10.

FIG. 11 shows a schematic representation of non-volatile memory media 1100a (e.g., computer disc (CD) or digital versatile disc (DVD)) and 1100b (e.g., universal serial bus (USB) memory stick) storing instructions and/or parameters 1102 which when executed by a processor, such as the image signal processor 114, 214 or 314 of FIGS. 1 to 3 allow the processor to perform one or more of the steps of the methods described above.

Various embodiments with different variations have been described here above. It should be noted that those skilled in the art may combine various elements of these various embodiments and variations.

Such alterations, modifications, and improvements are intended to be part of this disclosure, and are intended to be within the scope of the claims. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   receiving an input signal at a leaky integrator;
   generating, at the leaky integrator, a first output signal by integrating a leaked signal over an integration time, wherein the leaked signal is obtained based on a dampening signal, a leak factor, and the input signal; and
   providing the first output signal, wherein an offset of the dampening signal varies based on one or more of whether the input signal includes a periodic oscillation and a duty cycle of the periodic oscillation.

2. The method of claim 1, wherein the integrating the leaked signal includes multiplying the dampening signal, the leak factor and a difference signal between the input signal and a second output signal of the leaky integrator that precedes the first output signal.

3. The method of claim 1, wherein the leak factor is fixed over the integration time.

4. The method of claim 1, wherein the dampening signal is variable over the integration time.

5. The method of claim 4, wherein the dampening signal varies based on one or more of whether the input signal incudes a periodic oscillation, a duty cycle of the periodic oscillation, and a frequency of the periodic oscillation.

6. The method of claim 4, wherein the dampening signal varies between 0 and 1.

7. The method of claim 5, wherein the dampening signal varies between 0 and $0+\Delta_1$, $\Delta_1$ being lower than 1, in a case that the input signal includes a periodical oscillation; and
wherein the dampening signal varies between $1-\Delta_2$ and 1, $\Delta_2$ being greater than 0, in a case the input signal includes an aperiodic oscillation.

8. The method of claim 6, wherein amplitude of the dampening signal varies based on a frequency of a periodic oscillation included in the input signal.

9. The method of claim 2, wherein the dampening signal is determined by acts including:
generating an upper difference signal by integrating the difference signal over the integration time when the difference signal is positive;
generating a lower difference signal by integrating the difference signal over the integration time when the difference signal is negative; and
generating the dampening signal based on an upper intermediate signal and a lower intermediate signal.

10. The method of claim 9, wherein generating the dampening signal based on the upper difference signal and the lower difference signal is based on:

$$D(n) = 1 - \frac{UpperDiff(n) \times LowerDiff(n)}{\left(\frac{UpperDiff(n) + LowerDiff(n)}{2}\right)^2}$$

wherein 'D' the dampening signal, 'UpperDiff' is the upper difference signal and 'LowerDiff' is the lower difference signal.

11. The method of claim 1, wherein the first output signal is provided to control a function of controlling an optical sensor, the function including an exposure control function, a white balance control function or a tone mapping control function.

12. A system, comprising:
an optical sensor configured to obtain an image;
a statistics determination unit configured to generate a statistics signal based on the image;
a leaky integrator configured to generate a first filtered statistics signal by integrating a leaked signal based on a dampening signal, a leak factor, and the statistics signal; and
a control unit configured to control a parameter of the optical sensor based on the first filtered statistics signal,
wherein the integrating the leaked signal includes multiplying the dampening signal, the leak factor and a difference signal between the statistics signal and a second filtered statistics signal of the leaky integrator that precedes the first filtered statistics signal; and
wherein amplitude of the dampening signal is determined based on a frequency of a periodic oscillation included in the statistics signal.

13. The system of claim 12, wherein the dampening signal is determined based on one or more of whether the statistics signal includes the periodic oscillation or an aperiodic oscillation, a duty cycle of the periodic oscillation, and the frequency of the periodic oscillation.

14. The system of claim 13, wherein the dampening signal is in a range between 0 and $0+\Delta_1$, $\Delta_1$ being lower than 1, in a case that the statistics signal includes a periodical oscillation; and
wherein the dampening signal is in a range between $1-\Delta_2$ and 1, $\Delta_2$ being greater than 0, in the case the statistics signal includes the aperiodic oscillation.

15. The system of claim 12, wherein an offset of the dampening signal is determined based on one or more of whether the statistics signal includes the periodic oscillation, and a duty cycle of the periodic oscillation.

16. An integrated circuit, comprising:
a first circuitry that operates to generate a first signal based on at least one of a characteristic of an image and a parameter of an optical sensor in obtaining the image; and
a low-pass filter circuitry that operates to filter the first signal by integrating a leaked signal based on a dampening signal, a leak factor, and the first signal,
wherein the dampening signal is determined based on one or more of whether the first signal incudes a periodic oscillation or an aperiodic oscillation, a duty cycle of the periodic oscillation, and a frequency of the periodic oscillation.

17. The integrated circuit of claim 16, wherein the integrating the leaked signal includes multiplying the dampening signal, the leak factor and a difference signal between the first signal and an output signal of the low-pass filter circuitry that precedes the first output signal.

18. The integrated circuit of claim 16, wherein the leak factor is fixed over a time period of the integrating the leaked signal.

19. The integrated circuit of claim 16, wherein the dampening signal is variable over the time period of the integrating the leaked signal.

20. The integrated circuit of claim 16, wherein the dampening signal varies between 0 and 1.

* * * * *

UNITED STATES PATENT AND TRADEMARK OFFICE
CERTIFICATE OF CORRECTION

PATENT NO. : 11,290,656 B2  
APPLICATION NO. : 16/814467  
DATED : March 29, 2022  
INVENTOR(S) : Brian Douglas Stewart It is certified that error appears in the above-identified patent and that said Letters Patent is hereby corrected as shown below:

In the Claims

Column 19, Claim 5, Line 16:
"incudes" should read: --includes--.

Column 20, Claim 16, Line 41:
"incudes" should read: --includes--.

Signed and Sealed this
Twentieth Day of September, 2022

Katherine Kelly Vidal
*Director of the United States Patent and Trademark Office*